United States Patent
Ohta et al.

(10) Patent No.: US 8,692,105 B2
(45) Date of Patent: Apr. 8, 2014

(54) III-V NITRIDE-BASED THERMOELECTRIC DEVICE

(75) Inventors: Hiroaki Ohta, Tokyo (JP); Alexander Sztein, Goleta, CA (US); Steven P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 288 days.

(21) Appl. No.: 13/089,138

(22) Filed: Apr. 18, 2011

(65) Prior Publication Data

US 2011/0253187 A1    Oct. 20, 2011

Related U.S. Application Data

(60) Provisional application No. 61/325,177, filed on Apr. 16, 2010.

(51) Int. Cl.
*H01L 35/12* (2006.01)
*H01L 35/30* (2006.01)

(52) U.S. Cl.
USPC .................... 136/236.1; 136/205

(58) Field of Classification Search
CPC ........................................ H01L 35/22
USPC .............................. 136/236.1, 205
See application file for complete search history.

(56) References Cited

U.S. PATENT DOCUMENTS

2010/0200837 A1*  8/2010  Zimmerman et al. ........... 257/13
2011/0210416 A1*  9/2011  Mantese ....................... 257/470

OTHER PUBLICATIONS

Pantha et al., Journal of Electronic Materials, vol. 38, No. 7, p. 1132-1135, 2009.*
Cho et al., Applied Physics Letters, vol. 77, No. 2, p. 247-249.*
Pantha et al., Applied Physics Letters, vol. 92, 042112 (2008).*
Yamaguchi et al., Applied Physics Letters, vol. 82, No. 13, p. 2065-2067 (2003).*
Romanov et al., J. Appl. Phys., vol. 100, 023522 (2006).*
Wang et al., "Atomistic simulation of the size and orientation dependences of thermal conductivity in GaN nanowires". Applied Physics Letters, vol. 90, 2007, pp. 161923-1 to 161923-3.
Yamaguchi, "Thermoelectric devices using InN and Al1-xInxN thin films prepared by reactive radio-frequency sputtering". Applied Physics Letters, vol. 84, No. 26, 2004, pp. 5344-5346.
Yamaguchi, "Thermoelectric properties of and devices based on freestanding GaN". Applied Physics Letters, vol. 86, 2005, pp. 252102-1 to 252102-3.
El-Masry et al., "Phase separation in InGaN grown by metalorganic chemical vapor deposition". Applied Physics Letters, vol. 72, No. 1, 1998, pp. 40-42.
Feng et al., "Cluster size and composition variations in yellow and red light-emitting InGaN thin films upon thermal annealing". Journal of Applied Physics, vol. 95, No. 10, 2004, pp. 5388-5396.

(Continued)

*Primary Examiner* — Eli Mekhlin
(74) *Attorney, Agent, or Firm* — Gates & Cooper LLP

(57) ABSTRACT

A method to suppress thermal conductivities of nitride films by using stacking faults and/or nano-scale In-composition fluctuation(s). Therefore, the present invention reduces thermal conductivity of nitride while keeping electrical conductivity high. In addition, In composition fluctuations can enhance the Seebeck coefficient through thermionic emission. The present invention further discloses a nitride based (e.g. GaN) thermoelectric lateral device with a short length.

19 Claims, 14 Drawing Sheets

(56) References Cited

OTHER PUBLICATIONS

Haskell et al., "Structural and morphological characteristics of planar (1120) a-plane gallium nitride grown by hydride vapor phase epitaxy". Applied Physics Letters, vol. 83, No. 8, 2003, pp. 1554-1556.

Izaki et al., "Roll-type thermoelectric devices with InN thin films". Applied Physics Letters. vol. 87, 2005, pp. 243508-1 to 243508-3.

Jezowski et al., "Thermal conductivity of GaN crystals in 4.2-300 K range". Solid State Communications, vol. 128, 2003, pp. 69-73.

Kaeding et al., "Realization of high hole concentrations in Mg doped semipolar (1011) GaN". Applied Physics Letters, vol. 89, 2006, pp. 202104-1 to 202104-3.

Kotchetkov et al., "Effect of dislocations on thermal conductivity of GaN layers." Applied Physics Letters, vol. 79, No. 26, 2001, pp. 4316-4318.

McLaurin et al., "Growth of p-type and n-type m-plane GaN by molecular beam epitaxy." Journal of Applied Physics, vol. 100, 2006, pp. 063707-1 to 063707-7.

McLaurin et al., "P-type conduction in stacking-fault-free m-plane GaN". Phys. Stat. Sol. (RRL), vol. 1, No. 3, 2007, pp. 110-112.

Narukawa et al., "Role of self-formed InGaN quantum dots for exciton localization in the purple laser diode emitting at 420 nm." Applied Physics Letters, vol. 70, No. 8, 1997, pp. 981-983.

Vashaee et al., "Improved Thermoelectric Power Factor in Metal-Based Superlattices". Physical Review Letters, vol. 92, No. 10, 2004, pp. 106103-1 to 106103-4.

* cited by examiner

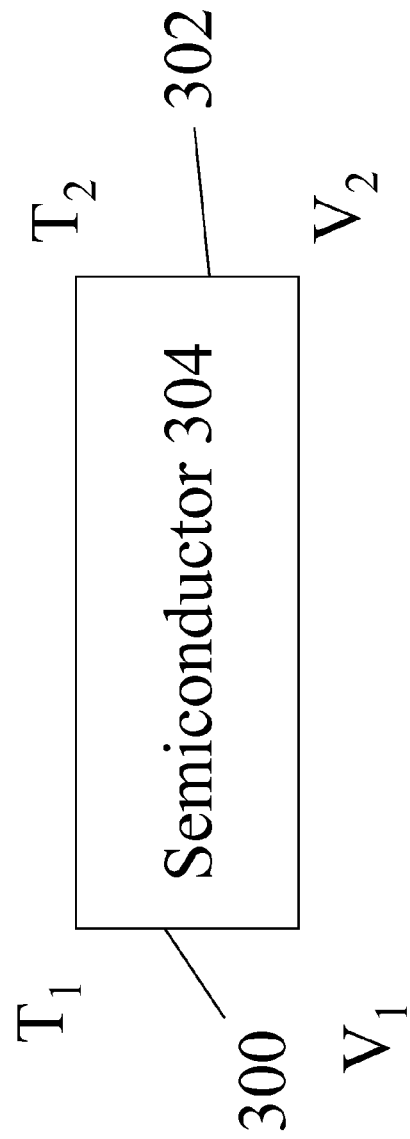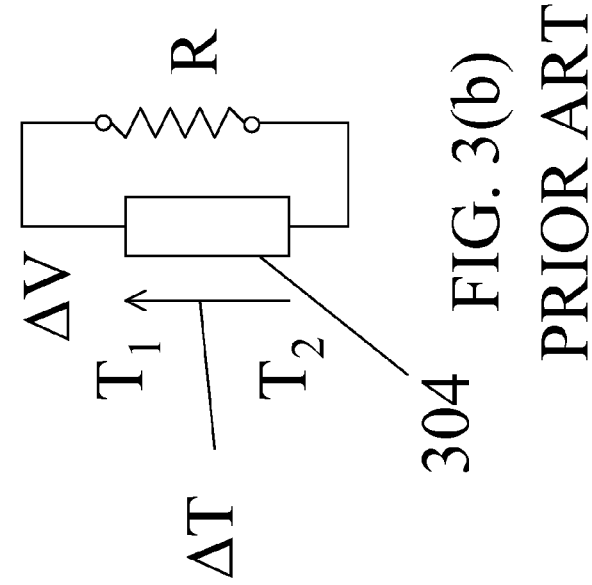
FIG. 3(a) PRIOR ART
FIG. 3(b) PRIOR ART

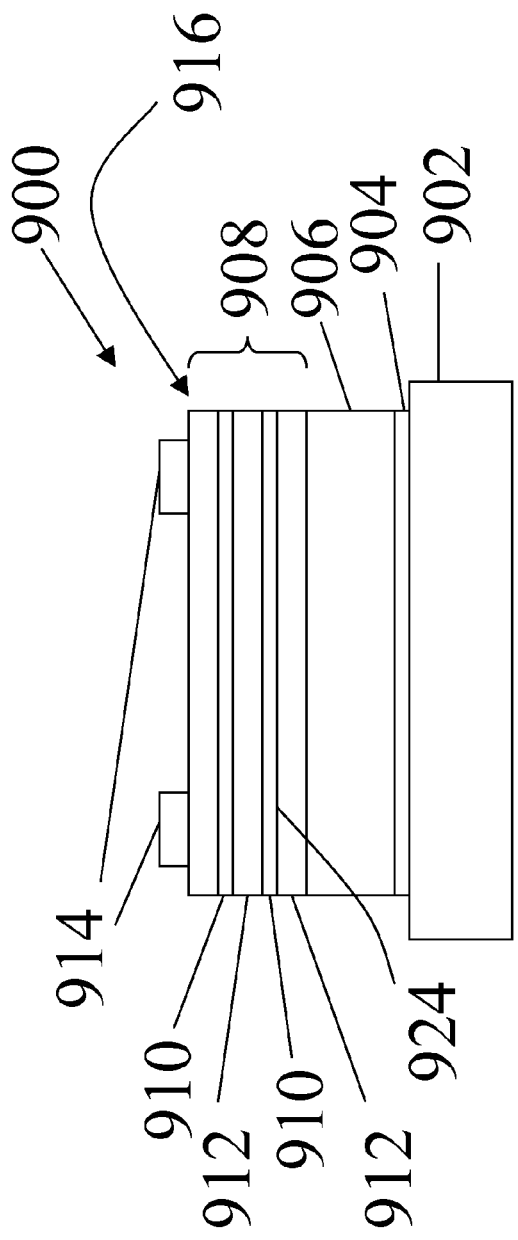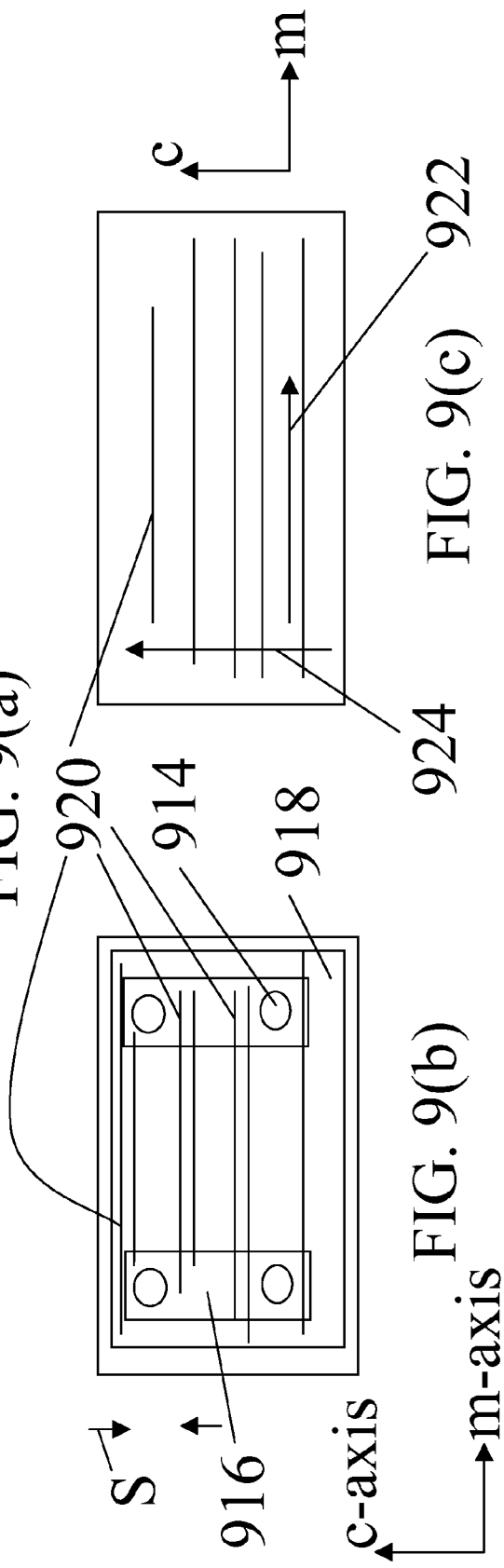
FIG. 9(a)
FIG. 9(b)
FIG. 9(c)

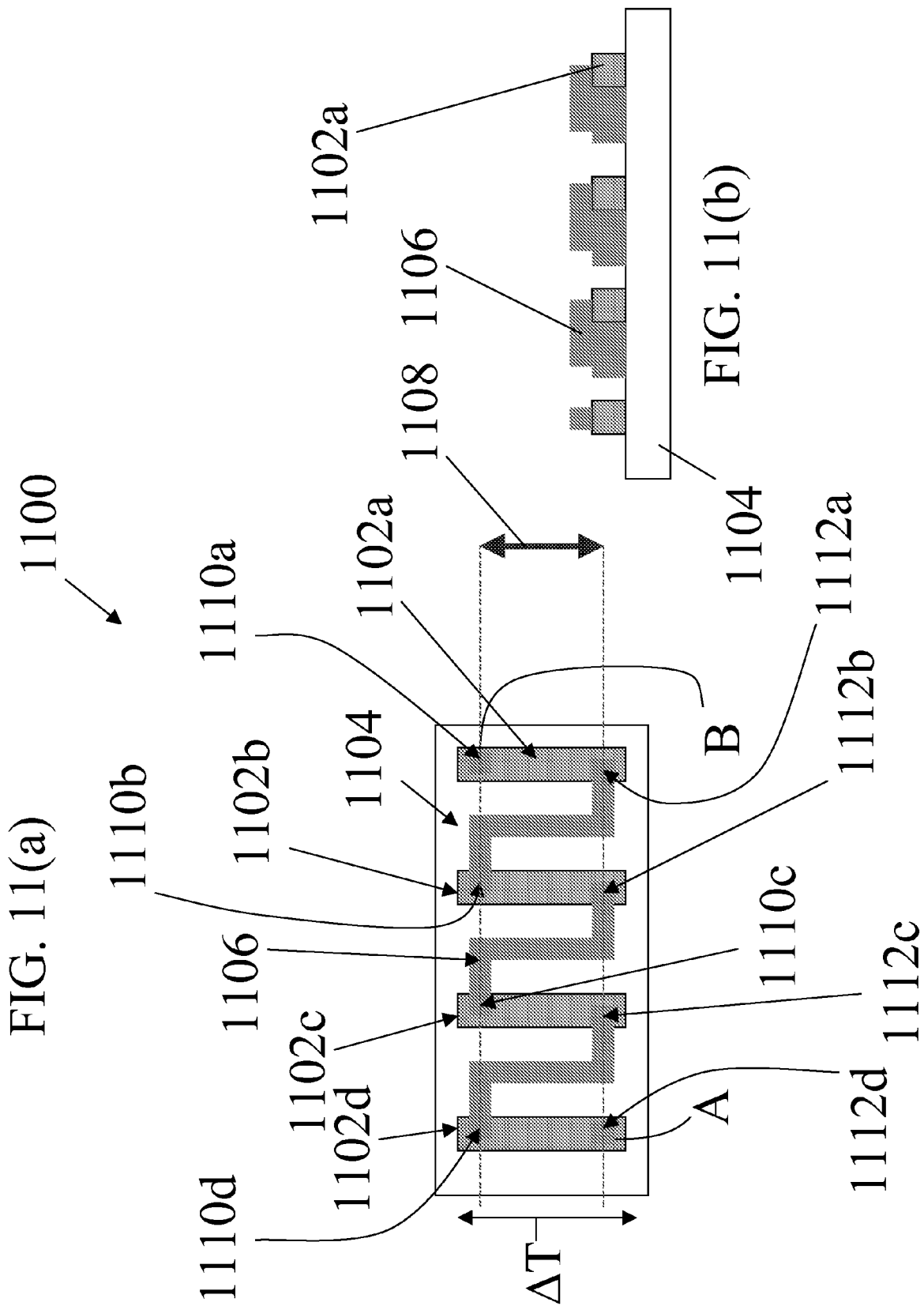

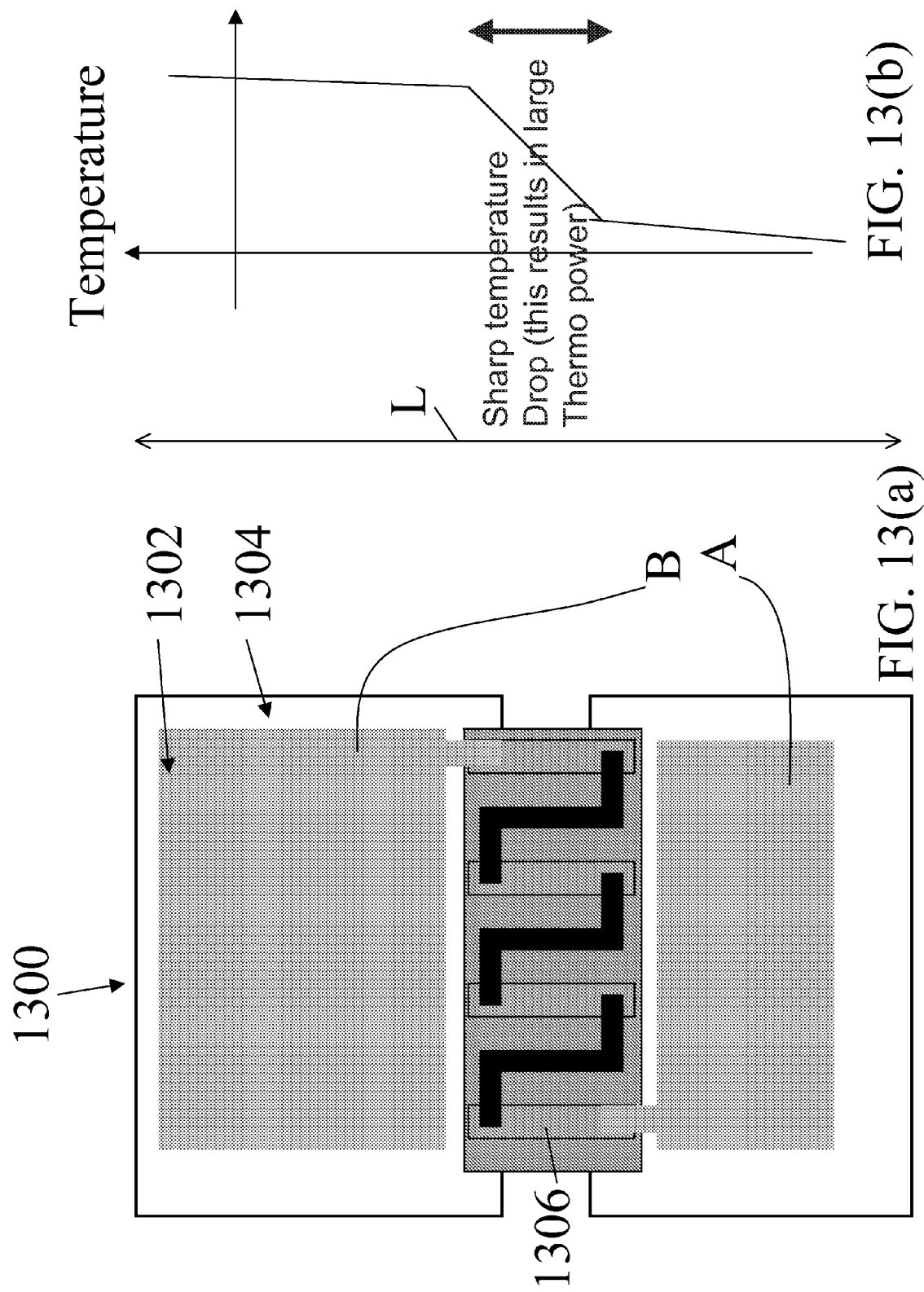

III-V NITRIDE-BASED THERMOELECTRIC DEVICE

CROSS REFERENCE TO RELATED APPLICATIONS

This application claims the benefit under 35 U.S.C. Section 119(e) of the following commonly-assigned application:

U.S. Provisional Application Ser. No. 61/325,177, filed on Apr. 16, 2010, by Hiroaki Ohta, Hiroaki Ohta, Alexander Sztein, Steven P. DenBaars, and Shuji Nakamura, entitled "III-V NITRIDE-BASED THERMOELECTRIC DEVICE"; which application is incorporated by reference herein.

This application is related to the following co-pending and commonly-assigned U.S. patent applications:

U.S. Utility patent application Ser. No. 10/413,691, filed Apr. 15, 2003, by Michael D. Craven and James S. Speck, entitled "NON-POLAR A-PLANE GALLIUM NITRIDE THIN FILMS GROWN BY METALORGANIC CHEMICAL VAPOR DEPOSITION", which application claims priority to U.S. Provisional Patent Application Ser. No. 60/372,909, filed Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETERO STRUCTURE MATERIALS";

U.S. Utility patent application Ser. No. 12/207,407, filed Sep. 9, 2008, by Benjamin A. Haskell, Paul T. Fini, Shigemasa Matsuda, Michael D. Craven, Steven P. DenBaars, James S. Speck, and Shuji Nakamura, entitled "GROWTH OF PLANAR, NON-POLAR A-PLANE GALLIUM NITRIDE BY HYDRIDE VAPOR PHASE EPITAXY", which application is a continuation under 35 U.S.C. §120 of U.S. Utility patent application Ser. No. 10/537,385, filed on Jun. 3, 2005, by Benjamin A. Haskell, Paul T. Fini, Shigemasa Matsuda, Michael D. Craven, Steven P. DenBaars, James S. Speck, and Shuji Nakamura, entitled "GROWTH OF PLANAR, NON-POLAR GALLIUM NITRIDE BY HYDRIDE VAPOR PHASE EPITAXY", now U.S. Pat. No. 7,427,555, issued on Sep. 23, 2008, which application claims the benefit under 35 U.S.C. §365(c) of PCT International Application No. PCT/US03/21916, filed on Jul. 15, 2003, by Benjamin A. Haskell, Michael D. Craven, Paul T. Fini, Steven P. DenBaars, James S. Speck, and Shuji Nakamura, entitled "GROWTH OF PLANAR, NON-POLAR A-PLANE GALLIUM NITRIDE BY HYDRIDE VAPOR PHASE EPITAXY", which application claims priority to and the benefit under 35 U.S.C. §119(e) of U.S. Provisional Patent Application Ser. No. 60/433,843, filed on Dec. 16, 2002, by Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE BY HYDRIDE VAPOR PHASE EPITAXY", and U.S. Provisional Application Ser. No. 60/433,844, filed on Dec. 16, 2002, by Benjamin A. Haskell, Paul T. Fini, Shigemasa Matsuda, Michael D. Craven, Steven P. DenBaars, James S. Speck, and Shuji Nakamura, entitled "TECHNIQUE FOR THE GROWTH OF PLANAR, NON-POLAR A-PLANE GALLIUM NITRIDE BY HYDRIDE VAPOR PHASE EPITAXY"; and U.S. Provisional Patent Application Ser. No. 61/169,984, filed on Apr. 16, 2009, by Hiroaki Ohta, Steven P. DenBaars, and Shuji Nakamura, entitled "III-V NITRIDE-BASED THERMOELECTRIC DEVICE"; all of which applications are incorporated by reference herein.

BACKGROUND OF THE INVENTION

1. Field of the Invention

This invention relates to a method to reduce thermal conductivity of nitrides, while at the same time keeping electrical conductivity high.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

III-V nitride is a wide band gap semiconductor, and therefore remains a good unipolar semiconductor even at high temperatures above, e.g., around 1000 degrees Kelvin (K). Furthermore, even at higher temperatures above 1000 K, the nitride semiconductor remains unipolar. This property makes the III-V semiconductor a promising material for use in thermoelectric devices. Generally, electrodes based on metal materials degrade at temperatures above about 1000 K, but some electrodes for nitrides still operate adequately at the high temperatures.

However, the nitride semiconductor's thermal conductivity is too large to use in a thermoelectric device (220 Watts per millikelvin (W/mK) measured by [1]). The application of III-V nitride films to thermoelectricity has been quite limited so far, and there is little documented research available in this area [2-4]. Because of the high thermal conductivity of nitride, nitride has not attracted attention. The thermoelectric performance can be described by the figure of merit, $ZT = \alpha^2 \sigma T/\kappa$, where $\alpha$, $\sigma$, $\kappa$, and T, are Seebeck coefficient, electrical conductivity, thermal conductivity, and absolute temperature, respectively.

For example, the long arrow 100 in FIG. 1 represents that AlInGaN 102 has good thermal conductivity, 220 W/mK at 300 K, along the direction of the long arrow 100, when the ends 104, 106 of the AlInGaN 102 are at temperatures $T_1$ and $T_2$, respectively, and the long arrow 108 represents the AlInGaN has good electrical conductivity along the direction of the long arrow 108. For this case, ZT is small.

This contrasts with FIG. 2, wherein the arrow 200 represents that a good thermoelectric material 202 has bad thermal conductivity (comparatively short arrow 200 as compared to arrow 100) along the direction of the short arrow 200 when the ends 204, 206 of the material 202 are at temperatures $T_1$ and $T_2$ respectively, yet maintains good electrical conductivity (as represented by the longer arrow 208) along the direction of the longer arrow 208. For this case, ZT is higher compared to the case shown in FIG. 1.

FIG. 3(a) and FIG. 3(b) illustrate basic thermoelectrics based on the Seebeck effect, wherein a temperature gradient $\Delta T = T_1 - T_2$ ($T_1 > T_2$) across the ends 300, 302 of a semiconductor 304 generates electromotive force, leading to thermopower (an induced thermoelectric voltage $\Delta V$) across the ends 300, 302 of the semiconductor 304, which can be used to drive (supply power to) a load R. As a result of the temperature gradient $\Delta T$, end 300 is at temperature $T_1$ and voltage $V_1$, and end 302 is at temperature $T_2$ and voltage $V_2$.

SUMMARY OF THE INVENTION

The present invention provides a method to reduce thermal conductivities by introducing randomly-located dislocation (s), in particular, high-density stacking faults, and/or by using microscopic alloy-fluctuation in an In-containing layer. These nano-scale structures in nitrides can disturb phonon propagation. Nano-scale composition fluctuations can also create electron barriers which can enhance the Seebeck coefficient through the process of thermionic emission. In addition, to increase stacking faults, the present invention uses state-of-the-art nonpolar/semipolar GaN technology. In such situations, the electrical conductivity can be kept at the same level as in usual nitride films. This is a novel approach for nitrides.

BRIEF DESCRIPTION OF THE DRAWINGS

Referring now to the drawings in which like reference numbers represent corresponding parts throughout:

FIG. 2 is a top view of a material exhibiting properties desirable for thermoelectrics (bad thermal conductivity and good electrical conductivity), wherein one end of the material is at a first temperature $T_1$, the other end is at a second temperature $T_2$, such that $T_2<T_1$, the length of the arrows indicate that the material has bad thermal conductivity (short arrow) and good electrical conductivity (longer arrow).

FIG. 3(a) and FIG. 3(b) are schematics illustrating basic thermoelectrics based on the Seebeck effect, wherein a temperature gradient $\Delta T=T_1-T_2$ ($T_1>T_2$) across the ends of a semiconductor (first end of the semiconductor at temperature $T_1$ and second end of the semiconductor at temperature $T_2$) generates electromotive force (with the first end of the semiconductor at a voltage $V_1$ and the second end of the semiconductor at a voltage $V_2$) leading to an induced thermoelectric voltage $\Delta V=V_2-V_1$ across the ends of the semiconductor, which can be used to drive (supply power to) a load R.

FIGS. 9(a)-(c) are schematics of a thermoelectric device of the present invention.

FIG. 11(a) is a top view schematic, and FIG. 11(b) is a side view schematic of a short thermoelectric device of the present invention.

FIG. 13(a) is a schematic of a non-monolithic thermoelectric device of the present invention, and FIG. 13(b) is a graph illustrating the temperature along the length of the device in FIG. 13(a).

DETAILED DESCRIPTION OF THE INVENTION

Figure 1:
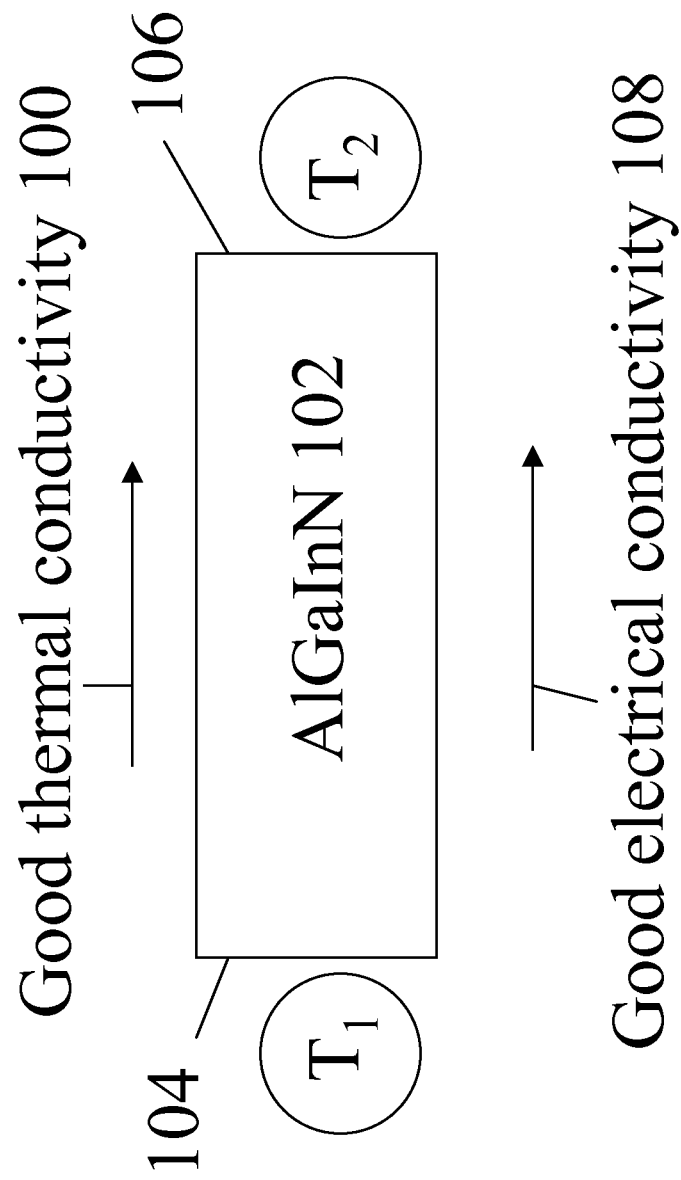
FIG. 1 is a schematic illustrating a top view of an AlInGaN device, wherein one end of the device is at a first temperature $T_1$, the other end is at a second temperature $T_2$, such that $T_2<T_1$, and the arrows indicate that AlInGaN has good thermal conductivity (220 W/mK at 300 K) and good electrical conductivity.
Figure 2:
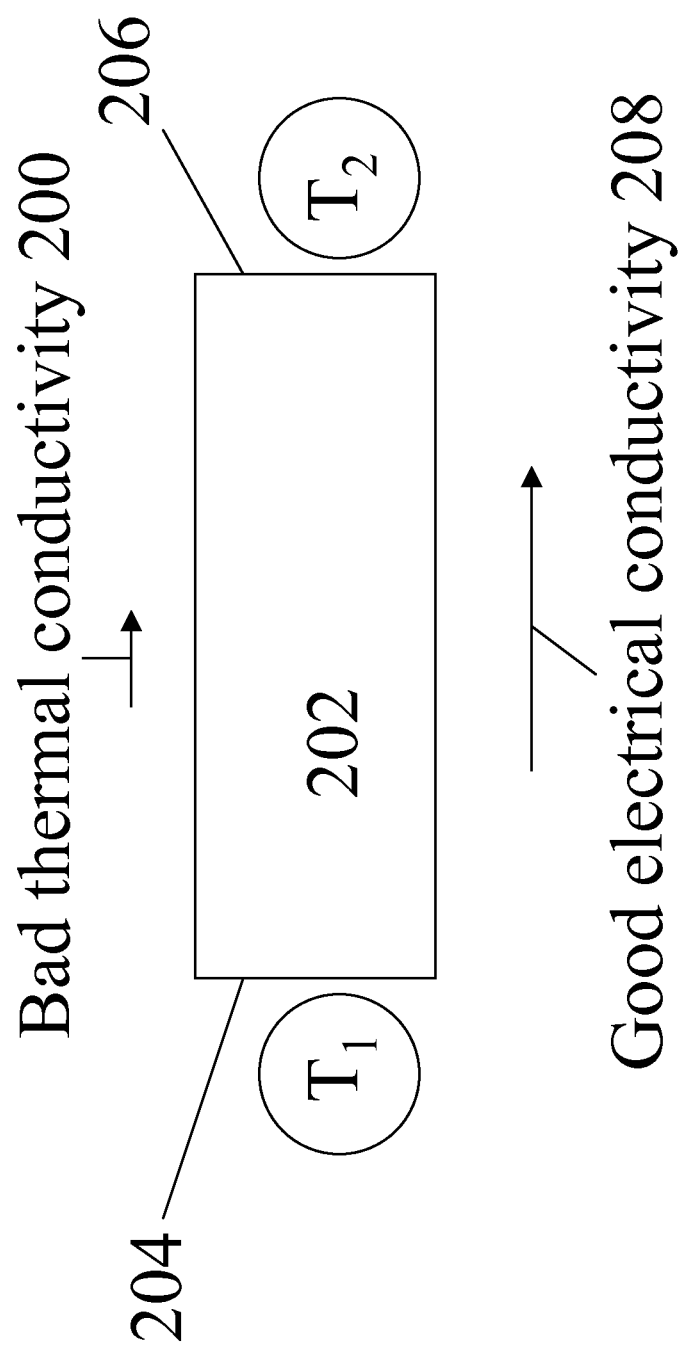
FIG. 2 is a schematic illustrating that for thermoelectrics bad thermal conductivity is needed.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

Thermoelectric devices are promising candidates for next generation energy sources, after solar cells. Thermoelectric devices generate an energy source from a temperature gradient. However, the thermal conductivity of nitride semiconductors is typically too large to use nitride semiconductors in a thermoelectric device. The technology described in the present invention provides a method to reduce the thermal conductivity by utilizing enhanced phonon scattering by randomly-located dislocation(s), in particular, high-density stacking faults. Nonpolar or semipolar nitride films are used. At the same time, the nitride semiconductor's electrical conductivity can be kept at the same level as usual/typical nitride films along the direction parallel to stacking faults. In addition, potential barriers associated with composition fluctuations can enhance the Seebeck coefficient through the process of thermionic emission.

Technical Description

The present invention uses nonpolar (11-20) nitride (a-plane nitride). Planar nonpolar a-plane GaN templates were grown by Metal Organic Chemical Vapor Deposition (MOCVD). The details of the template growth are disclosed in U.S. Utility patent application Ser. No. 10/413,691 entitled "NON-POLAR A-PLANE GALLIUM NITRIDE THIN FILMS GROWN BY METALORGANIC CHEMICAL VAPOR DEPOSITION", and U.S. Utility patent application Ser. No. 12/207,407, entitled "GROWTH OF PLANAR, NON-POLAR A-PLANE GALLIUM NITRIDE BY HYDRIDE VAPOR PHASE EPITAXY", which applications are incorporated by reference herein. These a-plane GaN templates provide a nearly lattice-matched layer on which the nonpolar InGaN films could be re-grown.

The MOCVD growths were carried out in a high-temperature vertical reactor with high-speed rotation. A rotation speed of 300 revolutions per minute (rpm) was employed. The precursors used for Ga, In, Al, Mg and Si sources were trimethylgalium (TMG), trimethylindium (TMI), trimethylaluminium (TMA), bis-cyclopentadienyl magnesium ($Cp_2Mg$), and disilane, respectively. High-purity ammonia was used as the nitrogen source. The a-plane GaN template on r-plane sapphire substrate is grown by a two-step process which includes a low temperature (620-650° C.) GaN nucleation layer step and a high temperature (1130-1180° C.) GaN growth step. A V/III ratio between 650 and 670 is used. The GaN growth rate, measured by an in-situ thickness measurement using reflectance spectroscopy, is in the range 4-6 Angstroms/second. A total flow of 10 standard liters per minute (slpm) is employed during the unintentionally doped (UID) GaN growth. The total thickness of undoped GaN is about 0.1-5 microns (μm). Less than 0.1 micron is preferable to prevent undesired heat conduction through this layer.

Figure 4:
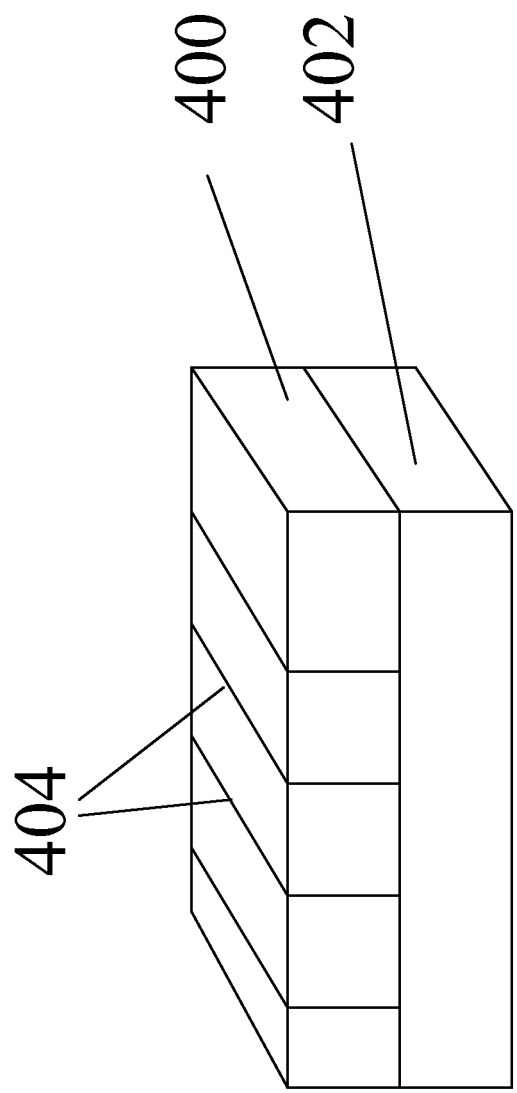
FIG. 4 is a schematic of a-plane GaN grown on r-plane sapphire.

FIG. 4 is a schematic illustrating a-plane GaN 400 grown on an r-plane sapphire heterosubstrate 402, wherein the heterosubstrate 402 causes many stacking faults 404 (disorder of the crystal structure) because of lattice mismatch between the heterosubstrate and the a-plane GaN.

Figure 5:
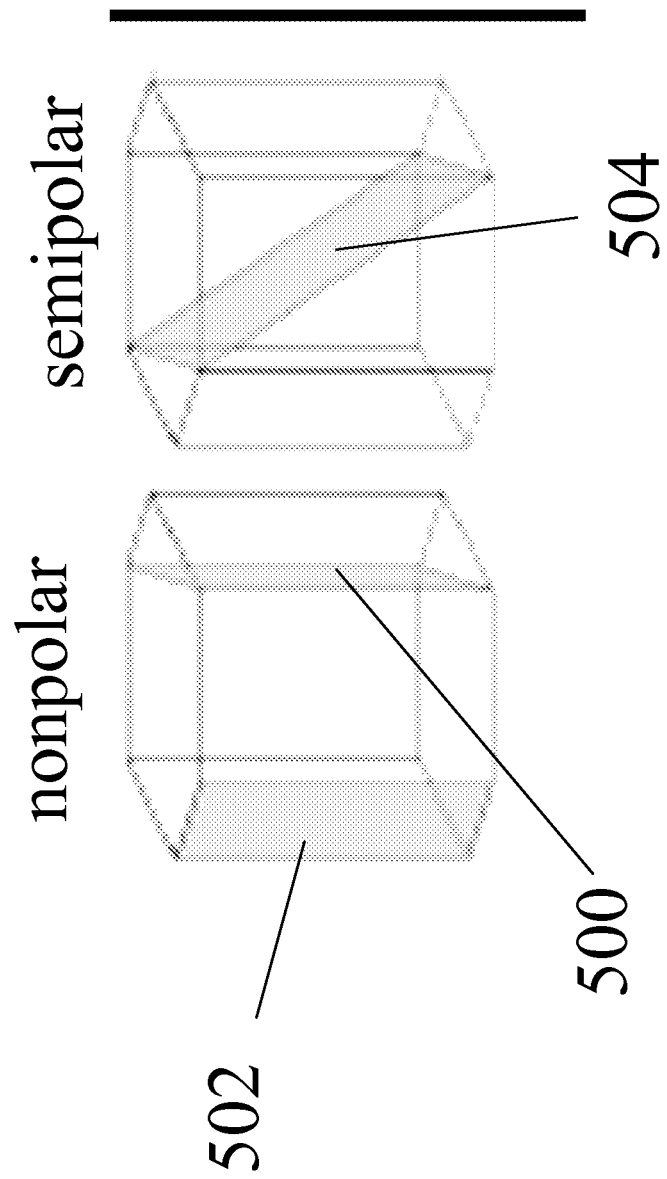
FIGS. 5(a) and 5(b) are schematics illustrating relevant planes in III-nitride wurtzite crystals.

FIG. 5(a) and FIG. 5(b) are schematics of III-nitride wurtzite crystals showing an a-plane 500, an m-plane 502, and one of the semipolar planes 504.

After growth of the a-plane nitride (e.g. UID GaN) template, an InGaN/GaN heterostructure region for the device is grown on the UID a-plane GaN template at a reduced temperature, at atmospheric pressure (near or at approximately 600-850 Torr), using $N_2$ carrier gas. The crystalline growth of the InGaN/GaN heterostructure comprises the following steps:

(1) The nonpolar InGaN layers are grown on the a-plane GaN substrate or template at a reduced temperature (near or at approximately 900° C.) using an $N_2$ carrier gas to enhance In incorporation and decrease In desorption; in addition, the InGaN layers are grown near or at atmospheric pressure (near or at approximately 760 Torr) to enhance InGaN film quality and decrease carbon incorporation.

(2) A GaN layer is grown on the nonpolar InGaN layers (at the same temperature as, or a higher temperature than, the InGaN growth temperature in step (1)). Preferably, this growth is repeated, and the heterostructure is comprised of a 10-100 period multi quantum well (MQW) stack with 10 nm Si-doped GaN barriers and 5 nm Si—$In_{0.2}Ga_{n0.8}N$ quantum wells. It is also preferable to have a higher In-composition. The total InGaN/GaN thickness is 0.15-1.5 microns. Thicker is more preferable to reduce resistivity in thermoelectric devices.

Figure 6:
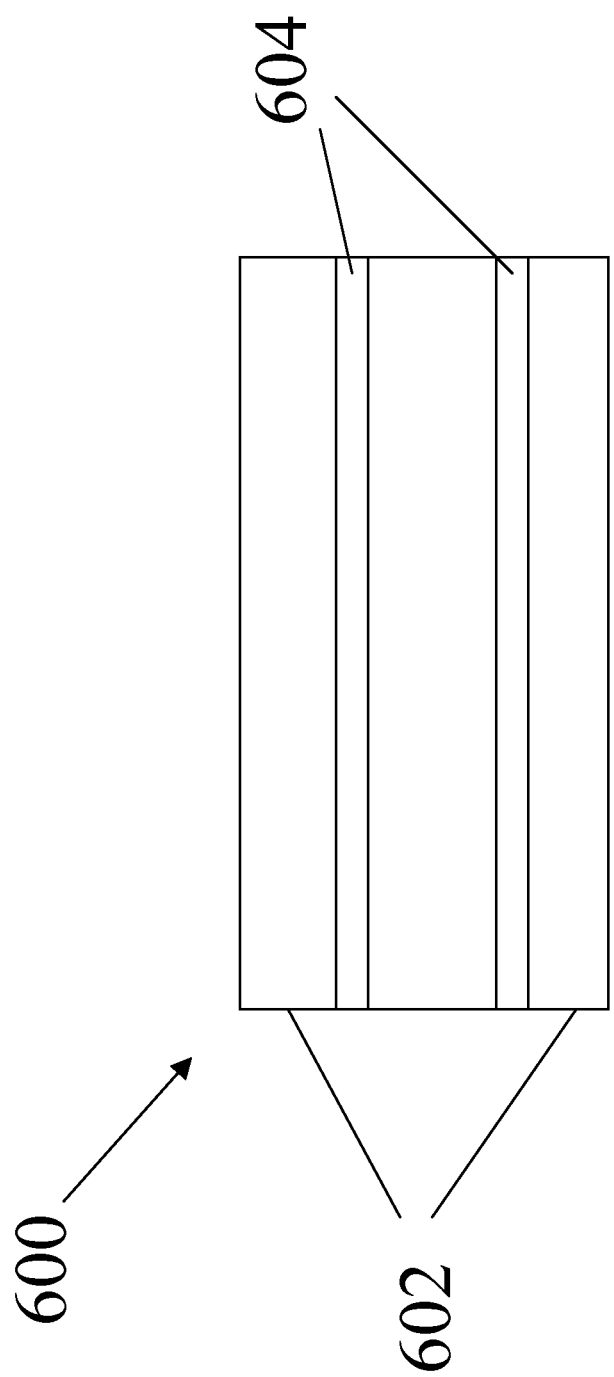
FIG. 6 is a cross-sectional schematic of a resulting superlattice or MQW structure, with GaN layers and InGaN layers (e.g., with 15% In), wherein bulk InGaN or AlInGaN may also be used.

FIG. 6 is a cross-sectional schematic of a resulting superlattice or MQW structure 600, with GaN layers 602 and InGaN layers 604 (e.g. with 15% In). Bulk InGaN or AlInGaN are also applicable.

Figure 7:
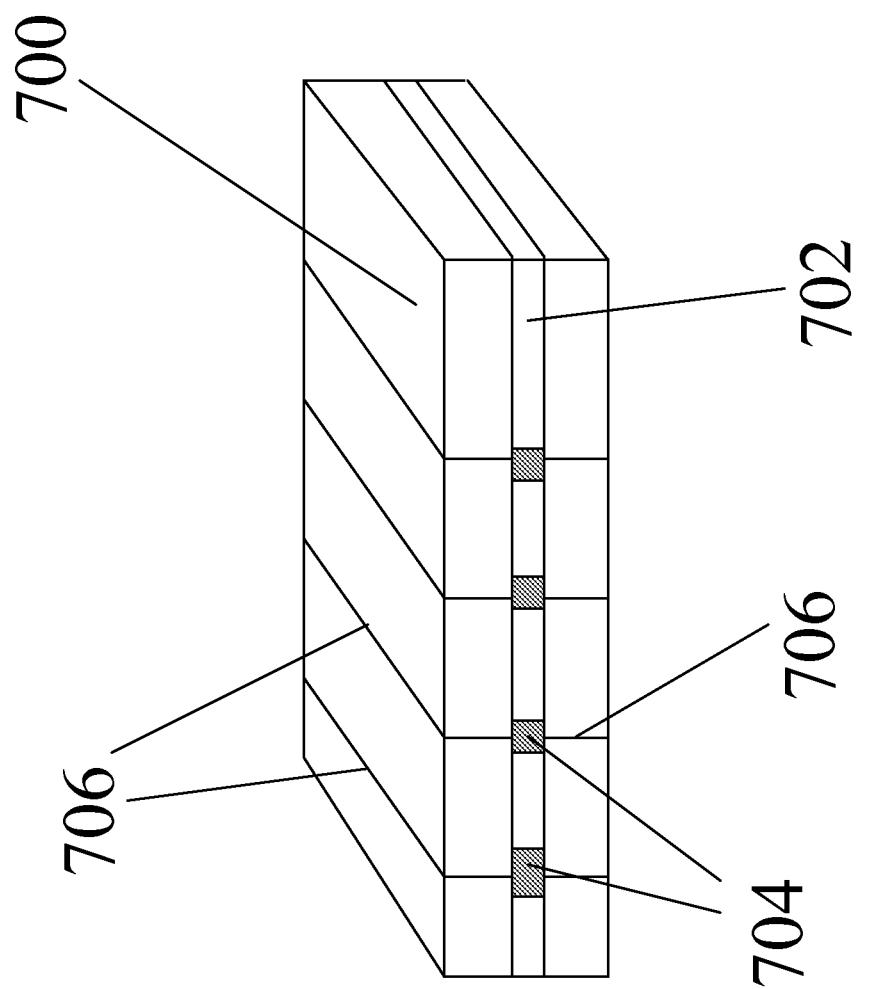
FIG. 7 is a schematic of InGaN and GaN layers, showing that In incorporation becomes higher at stacking faults (SFs).

FIG. 7 shows a GaN 700 and InGaN 702 structure, wherein the In composition is higher at regions 704 at stacking faults 706. As noted above, a typical In composition is 15% corresponding to an In composition that emits blue light, or has a bandgap that has an energy corresponding to the energy of a photon in the blue spectral range, for the case of InGaN. In particular, stacking faults, or some other kind of dislocation, enhance In-composition inhomogeneity. In-composition around stacking faults (or other kinds of dislocations) is higher than in the bulk region.

Figure 8:
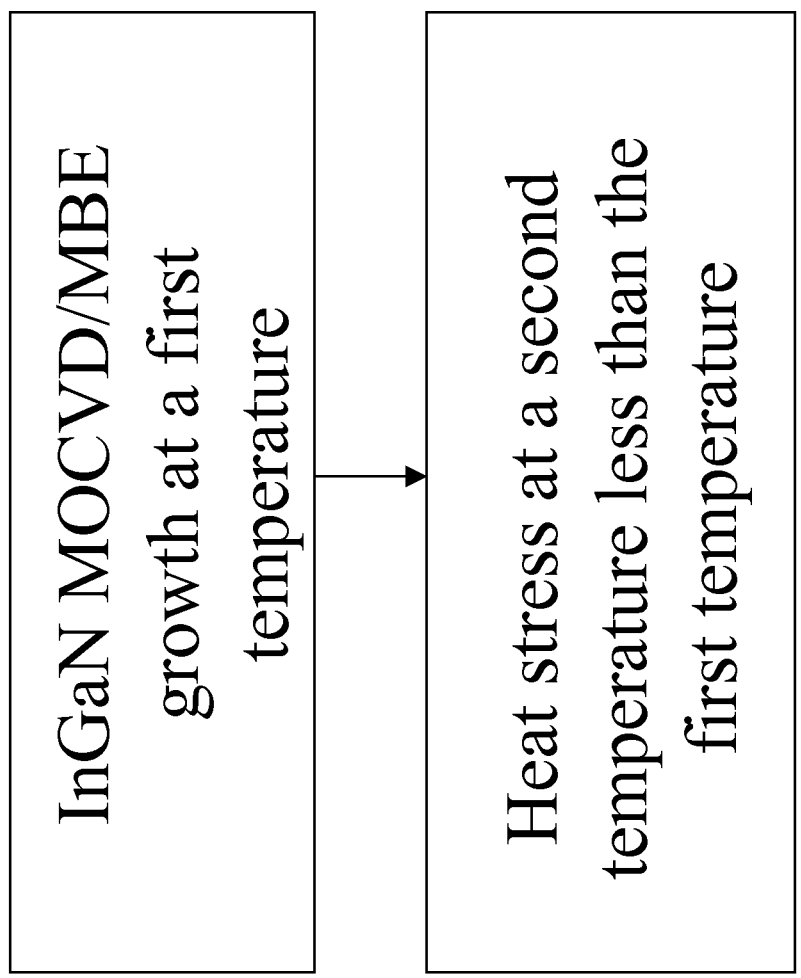
FIG. 8 is a flowchart illustrating a method of the present invention, illustrating growth of InGaN at a growth temperature x degrees Celsius (° C.), and subjecting the InGaN to heat stress at a temperature y° C., wherein x>y.
Figure 14:
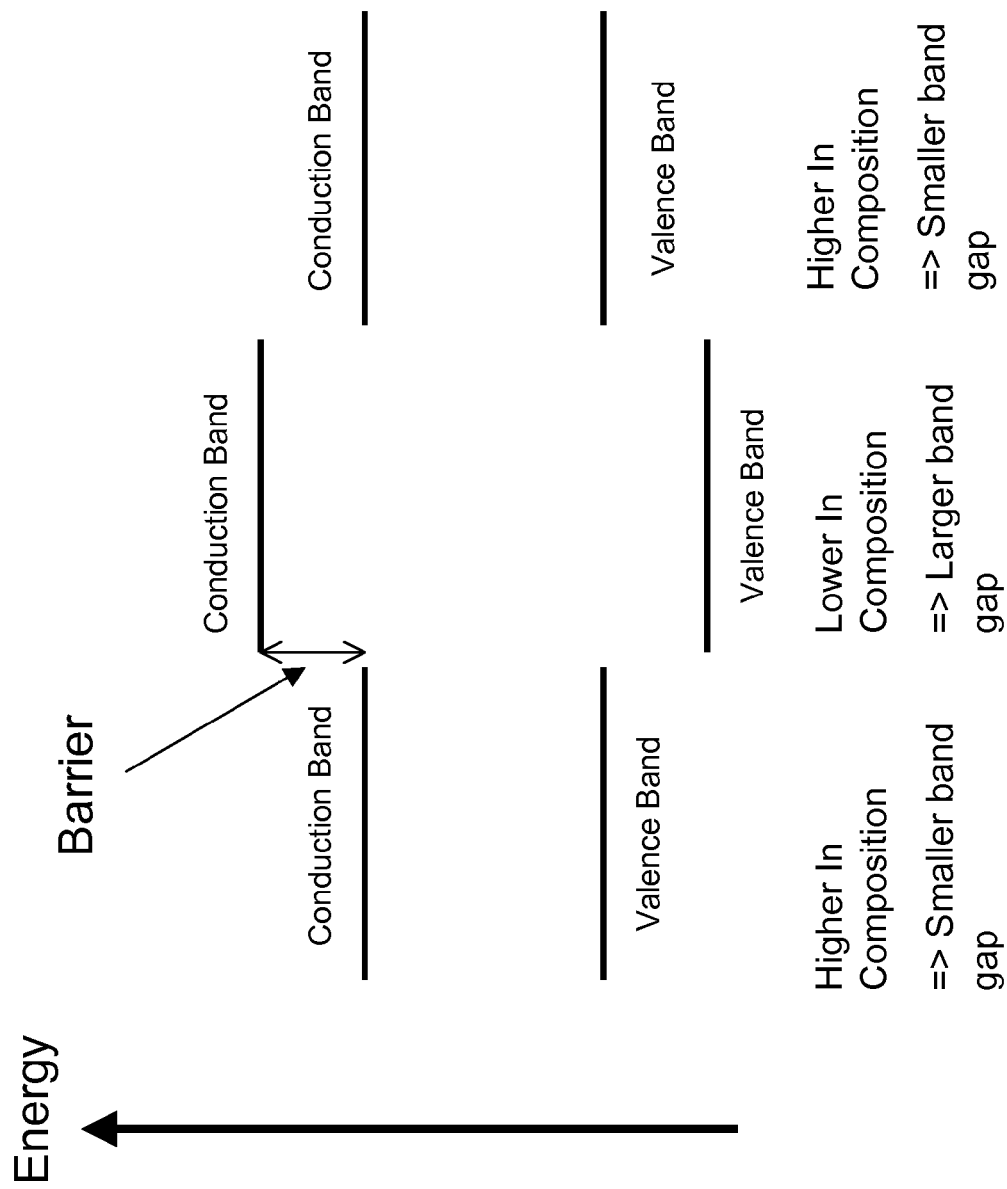
FIG. 14 is a diagram of the band structures for a material with fluctuating band gaps, wherein the barrier that is relevant to thermionic emission is identified.

After the crystalline growth of the InGaN/GaN heterostructure, the In-containing film may be subjected to, or suffer heat stress at a higher temperature than the growth temperature of the InGaN/GaN heterostructure [6] (FIG. 8). The heat stress causes further phase separation of alloy or In separation in In-containing layers. This causes further enhancement of phonon scattering. In addition, composition fluctuations can enhance the Seebeck coefficient though the process of thermionic emission [14]. This is achieved because the band gap of the III-V alloys changes with composition. Therefore, a relatively high In composition alloy adjacent to a relatively low In composition alloy will create a potential barrier as depicted in FIG. 14. This potential barrier can filter out low energy carriers, effectively increasing the Seebeck coefficient. The use of composition fluctuations to enhance the Seebeck coefficient through thermionic emission within the AlInGaN system is completely novel and has never been reported. This enhancement of the Seebeck coefficient occurs simultaneously with increased phonon scattering.

After the growth and/or heat stress of the MQW/heterostructure, the present invention can deposit Si-doped GaN (typically 50 nm thick) at 1065° C. to get good ohmic contact. Ti/Al/Ni/Au (typically 10/100/10/100 nm) is then deposited on this as-grown wafer, using the usual photolithography using photoresist, and an e-beam evaporator.

After deposition of the Ti/Al/Ni/Au, a mesa is formed, by dry etching, or etching to a UID or insulating substrate.

The end result of the above-described method is a thermoelectric device according to the present invention, as illustrated in FIGS. 9(a)-(c). FIGS. 9(a)-(c) are schematics of a thermoelectric device 900 comprising r-plane sapphire substrate 902, low temperature (LT) buffer layer 904 on the r-plane sapphire substrate 902, undoped GaN 906 (less than 0.1 micron thick) on the LT buffer layer 904, InGaN/GaN superlattice 908 (SL) (comprising InGaN 910 and GaN 912) on the undoped GaN 906, and Ti/Al/Ni/Au contacts 914 formed on the SL 908. The top view (FIG. 9(b)) shows that a mesa 916 comprising the InGaN/GaN superlattice 908 may be formed by etching an etched region 918 down to the undoped GaN 906 or sapphire 902. Also shown, in FIGS. 9(b) and 9(c), is the direction of the stacking faults 920, and the c-axis (c) and m-axis (m) directions. FIG. 9(c) also shows the direction 922 of high electrical conductivity and the direction 924 of low electrical conductivity in the InGaN/GaN SL 908. For cases of other crystalline orientation, the device direction should be selected to satisfy FIG. 9(c).

FIGS. 9(a)-(c) illustrate a thermoelectric device 900 using a group III-V nitride semiconductor 908 including stacking faults or dislocations 920. The nitride semiconductor 908 may be a film, for example. Heat conduction of the semiconductor 908 is mainly determined by phonon propagation. Basically, dislocation and disorder act as a phonon scattering center. The heat conductivity is reduced by increasing phonon scattering using the stacking faults 920. FIGS. 9(a)-(c) also illustrate a thermoelectric device 900 using a group III-V nitride semiconductor 908 including In 910. The nitride semiconductor including In, which is typically a nitride film 908, has In-composition fluctuation or alloy disorder. The heat conductivity is suppressed by phonon scattering by microscopic alloy inhomogeneity. A Typical In composition is more than 15% (so the film 908 has a bandgap that has an energy corresponding to the energy of a photon in the blue spectral range, for the case of InGaN). In particular, stacking faults 920 enhance In-composition inhomogeneity. In-composition at Stacking faults 920 is higher than in bulk regions. Any resulting composition fluctuations may also enhance the Seebeck coefficient through thermionic emission.

The nitride film 908 is typically grown on a foreign substrate 902 having a lattice misfit with nitride 908, thereby causing a large lattice mismatch between the substrate 902 and the nitride 908. The large lattice mismatch causes high density stacking faults 920 and threading dislocations. The nitride semiconductor film 908 is typically also grown toward a direction which is not along the c-axis. If the growth direction is not along c-axis, stacking faults 920 parallel to c-plane are generated effectively. For example, the nitride semiconductor film 908 may be grown along nonpolar (e.g. (10-10) and (11-20)) axes, because in the nonpolar nitrides 908 on a foreign substrate 902, there exist many stacking faults 920 parallel to the c-plane [7]. Alternatively, the nitride semiconductor film 908 may be grown toward a semipolar direction, e.g. (11-22), (10-1-1), or (10-1-3) axes, for example, because semipolar nitrides also include many stacking faults 920. The effect of growing the film 908 in a direction that is not along the c-axis is to generate stacking faults effectively.

The foreign substrate 902 could be an r-sapphire, m-SiC, LiAlO$_2$, or m-sapphire substrate, for example, because nonpolar and semipolar nitride 908 can be grown on these substrates 902. Moreover, sapphire is a good insulator and has relatively low heat conductivity. It is also able to isolate electrically and thermally.

After device fabrication, thinning the substrate 902 is preferable to reduce undesirable heat conduction through the substrate 902.

The density of stacking faults 920 is typically more than $10^6$ cm$^{-1}$ (in nonpolar and semipolar GaN, this value is typical). The typical separation S between each fault 920 is about 10 nm. A previous study on nanowire GaN showed that a phonon mean free path of 10 nm was effective at reducing thermal conductivity [8,9].

In the thermoelectric device 900, the temperature gradient is imposed along the plane of stacking fault 920, in order to cause high electrical conductivity [10, 11, 12].

The device 900 of FIG. 9(a) comprises AlGaInN including at least one heterostructure 908 with different Al or In composition across the stacking faults 920. The effect is that heterointerface(s) (e.g. between GaN 912 and InGaN 910) cause 2-dimensional carriers that can enhance electrical conductivity while disturbing phonon propagation. In particular, the nitride semiconductor 908 includes a regular/irregular multilayers consisting of at least two kind of layers 910, 912 with different composition. The effect of the multi-layers 908 such as a super-lattice or MQW is to enhance phonon scattering due to the presence of interfaces. On the other hand, the two-dimensional carrier generated at heterointerface 924 causes high electrical conductivity. The nitride semiconductor 908 is typically InGaAlN with an In-composition is over 15%, so that a large In-composition fluctuation can be obtained in the In-rich InGaN layer 910 [5, 6, 13].

Figure 10:
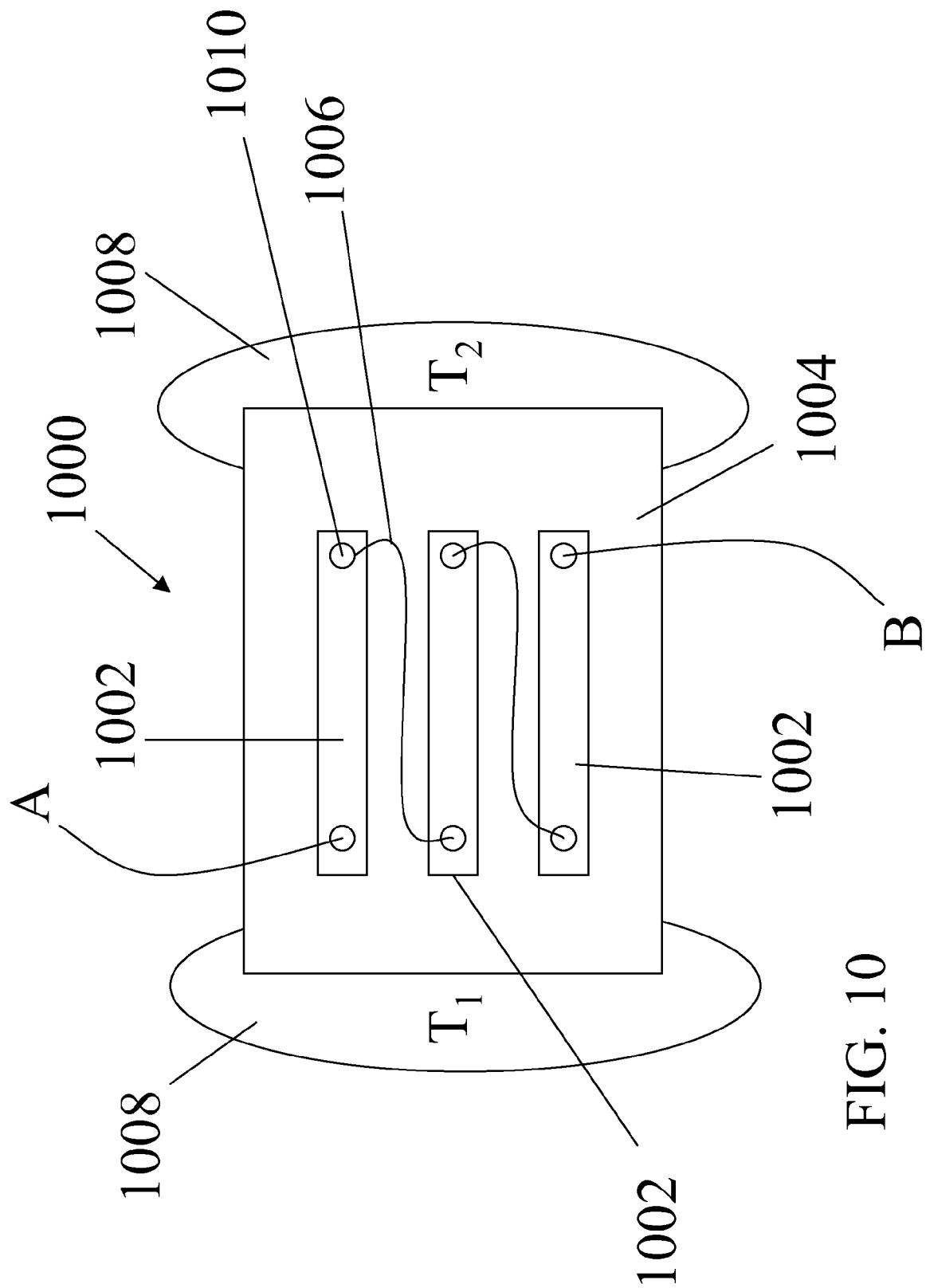
FIG. 10 is a schematic of a thermoelectric device of the present invention, wherein one or more mesas are connected in series.

FIG. 10 shows an embodiment of the device 1000 comprising multiple InGaN/GaN mesa regions 1002 on a sapphire substrate 1004, wherein the mesa regions 1002 are electrically connected to each other (e.g. using gold wires 1006) and to the outer circuit using contacts A and B, and the sapphire substrate is placed on a stages 1008 to supply the temperature gradient, so that one end of the device is at temperature $T_1$, and the other end is at temperature $T_2$ ($T_1 > T_2$), thereby forming a potential difference $\Delta V_{AB}$ between contacts A and B. Also shown are Ti/Al/Ni/Au contacts 1010, for example.

The present invention has described lateral thermoelectric devices on thermally and electrically insulating substrates. FIG. 11(a) and FIG. 11(b) illustrate another embodiment of the invention that improves the performance of the device by making the device shorter. FIG. 11(a), which is a top view of the device 1100, illustrates a device 1100 comprising III-V nitride mesas (1102a, 1102b, 1102c, and 1102d) on a sapphire substrate 1104 (the substrate 1104 is preferably an electrically and thermally insulating material), wherein the mesas 1102 a-d are electrically connected with interconnections 1106 and the distance 1108 is short. The internal (parasitic resistance) linearly depends on the summation of the lengths 1108 along each of the mesas 1102a-d (i.e. in this case, the parasitic resistance is proportional to 4 times the length 1108, because there are 4 mesas 1102a-d). Each of the mesas 1102a, 1102b, 1102c, and 1102d, have a first electrode (1110a, 1110b, 1110c, 1110d) and a second electrode (1112a, 1112b, 1112c, 1112d), wherein the second electrode (e.g. 1112a) of one mesa (e.g. 1102a) is joined by interconnection 1106 to the first electrode (e.g. 1110b) of a neighboring mesa (e.g. 1102b). Also shown is the temperature gradient $\Delta T$, so that the first electrode 1110a-d of each mesa 1102a-d is at a first temperature (e.g. $T_1$) and the second electrode 1112a-d of each mesa 1102a-d is at a second temperature (e.g. $T_2$). Thermopower is generated between points A (at electrode 1112d of mesa 1102d) and B (electrode 1110a of mesa 1102a). FIG. 11(b) is a side view of the device 1100.

Thus, FIGS. 11(a) and 11(b) also illustrate a lateral structure and that the distance 1108 of the thermoelectric device 1100 (or 1102a-d) is along the temperature gradient $\Delta T$. More specifically, the distance 1108 is between electrodes 1110a-d (at high temperature $T_1$) and electrodes 1112a-d (at low temperatures $T_2$). The distance 1108 should be less than 1000 microns, or preferably as short as possible, as explained below.

When considering the internal resistance (parasitic resistance) of the device 1100 (or 1102a-d), a shorter distance 1108 is preferable. However, a metal electrode 1110a-d, 1112a-d, that has a contact resistance, must also be fabricated. Therefore, the length 1108 (or size) of the device 1100 (or 1102a-d) is limited by the contact resistance of the metal electrodes 1110a-d, 1112a-d; when this contact resistance is considered, the preferable length 1108 of the device 1100 (or 1102a-d) is more than 1 micron.

Preferably, mesas 1102a, 1102b, 1102c, and 1102d should be connected in series to get larger thermopower, as shown in FIG. 11(a) and FIG. 11(b) (and FIG. 10, which shows the mesas 1002 connected in series). The total thermopower linearly depends on the summation of thermopowers in each element 1002, 1102a-d.

Figures 12A, 12B:
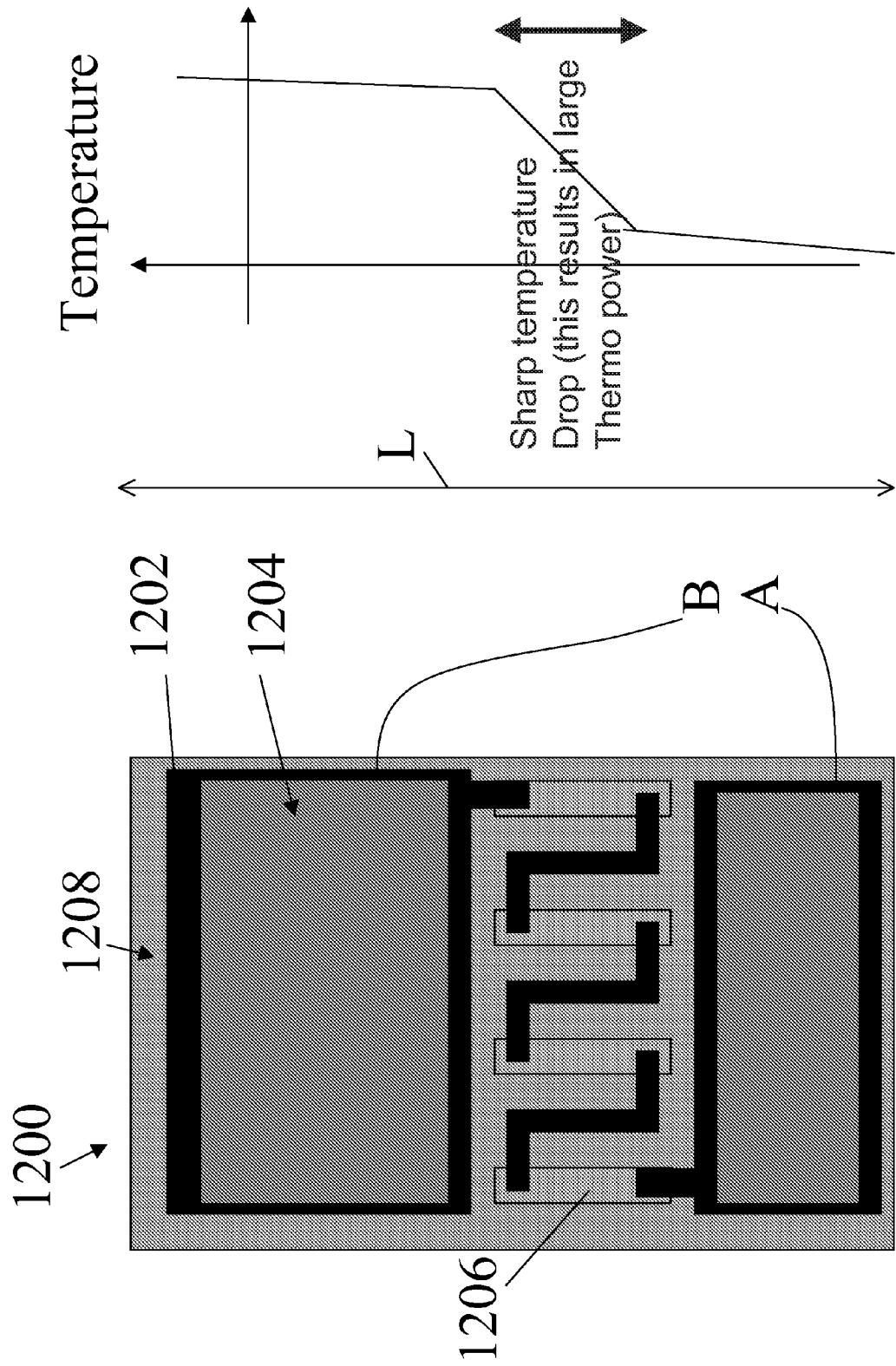
FIG. 12(a) is a schematic of a monolithic thermoelectric device of the present invention.
FIG. 12(b) is a graph illustrating the temperature along the length of the device in FIG. 12(a).

FIG. 12(a) is a schematic top view of a monolithic device 1200, comprising a contact or interconnection 1202, and a heat conductor (good heat conducting materials such as thick metal or remaining nitride mesa) 1204 on/under the contact or interconnection 1202 to obtain a good thermal conduction in the regions except for the region of the device comprising the III-nitride mesas 1206. FIG. 12(b) is a graph of the temperature as a function of distance along the length L of the device 1200 in FIG. 12(a), showing a sharp temperature drop in the region of the device comprising the III-nitride mesas 1206, resulting in large thermopower. An extremely thin thickness, less than 50 microns (μm), is preferable for the substrate 1208. Thinning the substrate 1208 except for regions under 1204 is more effective.

FIG. 13(a) is a schematic top view of a non-monolithic device 1300, comprising contact or interconnection 1302, high thermal conductivity materials 1304, and thermopower between electrodes A and B. FIG. 13(b) is a graph of the temperature as a function of distance along the length L of the device 1300 in FIG. 13(a), showing a sharp temperature drop in the region of the device comprising the III-nitride mesas 1306.

Possible Modifications

If the present invention uses a GaN bulk substrate, some kind of buffer layer can be used at the beginning of growth. A low-temperature (less than 800° C.) or AlN buffer is typically used. In order to introduce this buffer, it is possible to increase stacking faults and dislocations.

If the present invention uses a substrate with a thermal conductivity which is quite high, such as a GaN bulk substrate, SiC or Si, this high thermal conductivity substrate should be removed, or thinned, for example, by chemical mechanical polishing (CMP), mechanical polishing (MP) polishing, detachment by laser-irradiation, heating, or mechanical stress.

The present invention can grow various nitrides according to established technology. Combinations of substrate and grown nitride may be as follows:

1. {0001} GaN on {0001}/{11-20}-sapphire or {0001}GaN bulk substrate, {0001}SiC, {111}Si;
2. {10-10} GaN on {10-10} SiC, or LiAlO$_2$;
3. {10-1-1} GaN on {100} spinel;
4. {10-1-3} GaN on {110} spinel;

5. {11-22} GaN on {1-100} sapphire; and
6. {10-1-3} GaN on {1-100} sapphire.

Alternatively, for all cases, a GaN bulk substrate is applicable and may be used.

In order to obtain a p-type layer, the present invention uses Mg dopants instead of Si, thereby obtaining a p-type thermoelectric device. For p-type thermoelectric devices, possible electrodes (for contact metal) include, but are not limited to, Pd/Au, metal alloys including the platinum group, Ni/Au, ZnO, ZnO: Ga and ITO, etc Annealing at high temperature (more than 400° C.), in $N_2$ ambient to activate the acceptors (Mg) by removing H, is also required. A typical condition is annealing at more than 700° C., for less than 1 minute in $N_2$.

For n-type thermoelectric devices, possible electrodes include metal alloys such as Ti/Al/Ni/Au, Ti/Al, other Al-containing metal alloys, or silicides.

The present invention is effective in any III-V nitride, including simple c-plane GaN. Instead of stacking faults, other kinds of dislocations, such as threading dislocations, are effective. Instead of MOCVD, other kinds of growth can be used, for example, Hydride Vapor Phase Epitaxy and Molecular Beam Epitaxy.

Further Information

Further information on the present invention can be found in the Appendix of to the parent U.S. Provisional Application Ser. No. 61/325,177, filed on Apr. 16, 2010, by Hiroaki Ohta, Hiroaki Ohta, Alexander Sztein, Steven P. DenBaars, and Shuji Nakamura, entitled "III-V NITRIDE-BASED THERMOELECTRIC DEVICE", which application is incorporated by reference herein. The Appendix comprises a publication by Alexander Sztein, Hiroaki Ohta, Junichi Sonoda, Ashok Ramu, John E. Bowers, Steven P. DenBaars, and Shuji Nakamura, entitled "GaN-Based Integrated Lateral Thermoelectric Device for Micro-Power Generation," Applied Physics Express 2 (2009) 111003, which publication is incorporated by reference herein.

REFERENCES

The following references are incorporated by reference herein.
[1] Jezowski et al., Solid State commun., Vol. 128, p. 69, 2003.
[2] Yamaguchi et al., Applied Physics Letters (APL), Vol. 84, p. 5344, 2004.
[3] Izaki et al., APL, Vol. 87, p. 243508, 2005.
[4] Yamaguchi et al., APL, Vol. 86, p. 252102, 2005.
[5] N. A. El-Masry, APL, Vol. 72, p. 40, 1998 (reference on In fluctuations).
[6] S. W. Feng, Japanese Journal of Applied Physics 95, 5388 (2004) (after annealing, an In-rich region was formed).
[7] B. A. Haskell et. al., Applied Physics Letters, Vol. 83, No. 8, p. 1554 (2003).
[8] Zhiguo Wang et. al., Applied Physics Letters, Vol. 90, p. 161923 (2003).
[9] D. Kotchetkov et. al., Applied Physics Letters, Vol. 79, No. 26, p. 4316 (2001).
[10] Melvin McLaurin et. al., Phys. Stat. Sol. (RRL) 1, No. 3, p. 110 (2007).
[11] M. McLaurin et. al., Journal of Applied Physics, 100, p. 63707 (2006).
[12] Kaeding et. al., Applied Physics Letters Vol. 89, p. 202104 (2006).
[13] Yukio Narukawa et. al., Applied Physics Letters Vol. 70 (8), p. 981 (1997).
[14] Vashaee, D. & Shakouri, A., Physical Review Letters, 92, p. 106103/1 (2004).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A Group III-V nitride thermoelectric device comprising:
a nonpolar or semipolar Group III-V nitride semiconductor film having alloy fluctuations that create electron barriers for generating thermionic emissions; and
a first electrode and a second electrode in electrical contact with the nonpolar or semipolar Group III-V nitride semiconductor film;
wherein the first electrode and the second electrode are separated from each other along a temperature gradient of the nonpolar or semipolar Group III-V nitride semiconductor film, so that the first electrode is at a first temperature and the second electrode is at a second temperature different than the first temperature, and the temperature gradient generates electrical power in the nonpolar or semipolar Group III-V nitride semiconductor film that is extracted from the first electrode and the second electrode.

2. The device of claim 1, wherein an operating temperature of the Group III-V nitride thermoelectric device is greater than 250° C.

3. The device of claim 1, wherein:
the first electrode and the second electrode are separated laterally by a distance along the nonpolar or semipolar Group III-V nitride semiconductor film, and the distance is less than 1000 microns.

4. A thermoelectric device, comprising:
a nonpolar or semipolar Group III-V nitride semiconductor film including stacking faults or dislocations; and
a first electrode and a second electrode in electrical contact with the nonpolar or semipolar Group III-V nitride semiconductor film;
wherein the first electrode and the second electrode are separated from each other along a temperature gradient of the nonpolar or semipolar Group III-V nitride semiconductor film, so that the first electrode is at a first temperature and the second electrode is at a second temperature different than the first temperature, and the temperature gradient generates electrical power in the nonpolar or semipolar Group III-V nitride semiconductor film that is extracted between the first electrode and the second electrode.

5. The device of claim 4, wherein the stacking faults or dislocations increase phonon scattering, thereby reducing heat conductivity in the nonpolar or semipolar Group III-V nitride semiconductor film.

6. The device of claim 4, wherein the nonpolar or semipolar Group III-V nitride semiconductor film is grown on a foreign substrate having a lattice misfit with the nonpolar or semipolar Group III-V nitride semiconductor film, thereby causing a large lattice mismatch that causes a high density of the stacking faults or dislocations in the nonpolar or semipolar Group III-V nitride semiconductor film.

7. The device of claim 6, wherein the foreign substrate is an r-Sapphire, m-SiC, LiAlO$_2$, or m-Sapphire substrate.

8. The device of claim 4, wherein the nonpolar or semipolar Group III-V nitride semiconductor film is grown toward a direction which is not along a c-axis of the nonpolar or semipolar Group III-V nitride semiconductor film, so that the stacking faults or dislocations are generated.

9. The device of claim 4, wherein the nonpolar or semipolar Group III-V nitride semiconductor film is a nonpolar Group III-V nitride semiconductor film grown on a foreign substrate along nonpolar (10-10) or (11-20) axes of the nonpolar Group III-V nitride semiconductor film, thereby forming the stacking faults parallel to a c-plane of the nonpolar Group III-V nitride semiconductor film.

10. The device of claim 4, wherein the nonpolar or semipolar Group III-V nitride semiconductor film is a semipolar Group III-V nitride semiconductor film grown along semipolar (11-22), (10-1-1), or (10-1-3) axes of the nonpolar or semipolar Group nitride semiconductor film, to include the stacking faults in the nonpolar or semipolar Group III-V nitride semiconductor film.

11. The device of claim 4, wherein a density of the stacking faults is more than $10^6$ cm$^{-1}$.

12. The device of claim 4, wherein a density of the dislocations is more than $10^8$ cm$^{-2}$.

13. The device of claim 4, wherein the temperature gradient is imposed along a plane of the stacking faults in order to induce high electrical conductivity in the nonpolar or semipolar Group III-V nitride semiconductor film.

14. The device of claim 4, wherein the nonpolar or semipolar Group III-V nitride semiconductor film further comprises AlGaInN and at least one hetero-structure with a different Al or In composition in the AlGaInN across the stacking faults, and one or more hetero-interfaces of the hetero-structure disturb the phonon propagation in the nonpolar or semipolar Group III-V nitride semiconductor film.

15. A thermoelectric device comprising:
a nonpolar or semipolar Group III-V nitride semiconductor film containing indium (In) or aluminum (Al) and having stacking faults or dislocations, or alloy fluctuations; and a first electrode and a second electrode in electrical contact with the nonpolar or semipolar Group III-V nitride semiconductor film;
wherein the first electrode and the second electrode are separated from each other along a temperature gradient of the nonpolar or semipolar Group III-V nitride semiconductor film, so that the first electrode is at a first temperature and the second electrode is at a second temperature different than the first temperature, and the temperature gradient generates electrical power in the nonpolar or semipolar Group III-V nitride semiconductor film that is extracted between the first electrode and the second electrode.

16. The device of claim 15, wherein the nonpolar or semipolar Group III-V nitride semiconductor film is InGaAlN with an In-composition over 15%, so that a large In-composition fluctuation is obtained in InGaAlN of the nonpolar or semipolar Group III-V nitride semiconductor film.

17. The device of claim 15, wherein the nonpolar or semipolar Group III-V nitride semiconductor film containing In has an In-composition fluctuation or alloy disorder causing microscopic alloy inhomogeneity.

18. The device of claim 17, wherein heat conductivity in the nonpolar or semipolar Group III-V nitride semiconductor film is suppressed by the phonon scattering caused by the microscopic alloy inhomogeneity.

19. The device of claim 15, wherein:
the nonpolar or semipolar Group III-V nitride semiconductor film containing In is grown at a growth temperature; and
the nonpolar or semipolar Group III-V nitride semiconductor film containing In is subjected to a heat stress at a higher temperature than the growth temperature, wherein the heat stress causes structural changes such as phase separation of the alloy or In separation in the nonpolar or semipolar Group III-V nitride semiconductor film containing In, which in turn causes further enhancement of the phonon scattering in the Group III-V nitride semiconductor film.

* * * * *